United States Patent
Abe et al.

(10) Patent No.: US 9,634,211 B2
(45) Date of Patent: Apr. 25, 2017

(54) LIGHT-EMITTING MODULE

(71) Applicant: PANASONIC INTELLECTUAL PROPERTY MANAGEMENT CO., LTD., Osaka (JP)

(72) Inventors: Masumi Abe, Osaka (JP); Yasufumi Wada, Osaka (JP); Toshifumi Ogata, Osaka (JP); Kenji Sugiura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 316 days.

(21) Appl. No.: 14/421,138

(22) PCT Filed: Sep. 4, 2013

(86) PCT No.: PCT/JP2013/005224
§ 371 (c)(1),
(2) Date: Feb. 11, 2015

(87) PCT Pub. No.: WO2014/049973
PCT Pub. Date: Apr. 3, 2014

(65) Prior Publication Data
US 2015/0214451 A1    Jul. 30, 2015

(30) Foreign Application Priority Data

Sep. 26, 2012 (JP) ................. 2012-212865

(51) Int. Cl.
*H01L 33/62* (2010.01)
*H01L 23/00* (2006.01)
(Continued)

(52) U.S. Cl.
CPC ............ *H01L 33/62* (2013.01); *F21S 4/28* (2016.01); *F21V 23/005* (2013.01); *H01L 24/05* (2013.01);
(Continued)

(58) Field of Classification Search
CPC .......... H01L 2224/48247; H01L 33/62; H01L 25/0753; H01L 2224/48227; H01L 27/156;
(Continued)

(56) References Cited

U.S. PATENT DOCUMENTS 8,222,653 B2 * 7/2012 Tsuchiya ............... H01L 33/486
257/91
8,455,908 B2 * 6/2013 Welch ................. H01L 25/0753
257/100
(Continued)

FOREIGN PATENT DOCUMENTS

JP    2000-223751 A    8/2000
JP    2001-156331 A    6/2001
(Continued)

OTHER PUBLICATIONS

International Search Report issued in International Application No. PCT/JP2013/005224 with Date of mailing Dec. 10, 2013, with English Translation.

*Primary Examiner* — Bac Au
(74) *Attorney, Agent, or Firm* — McDermott Will & Emery LLP

(57) ABSTRACT

Each of a plurality of semiconductor light-emitting element has, on an upper surface thereof that has a quadrilateral shape, a pair of connecting portions having different polarities from each other. The pair of connecting portions are aligned on a diagonal of the quadrilateral shape. The diagonal intersects a row direction along which the semiconductor light-emitting elements within a row are arranged. Connecting portions having identical polarity are positioned on an imaginary line parallel to the row direction. Metal wires intersect two sides extending from a corner, on the diagonal, of the upper surface of each of the semiconductor light-emitting elements when viewed from a direction perpen- (Continued)

dicular to a mounting surface of a substrate for mounting the semiconductor light-emitting elements.

11 Claims, 8 Drawing Sheets

(51) Int. Cl.
| | | |
|---|---|---|
| *H01L 25/075* | (2006.01) | |
| *F21V 23/00* | (2015.01) | |
| *H01L 33/54* | (2010.01) | |
| *F21S 4/28* | (2016.01) | |
| *F21Y 105/10* | (2016.01) | |
| *F21Y 115/10* | (2016.01) | |

(52) U.S. Cl.
CPC .............. *H01L 24/48* (2013.01); *H01L 24/49* (2013.01); *H01L 25/0753* (2013.01); *H01L 33/54* (2013.01); *F21Y 2105/10* (2016.08); *F21Y 2115/10* (2016.08); *H01L 2224/04042* (2013.01); *H01L 2224/05555* (2013.01); *H01L 2224/451* (2013.01); *H01L 2224/48091* (2013.01); *H01L 2224/48137* (2013.01); *H01L 2224/48465* (2013.01); *H01L 2224/4911* (2013.01); *H01L 2224/4945* (2013.01); *H01L 2224/49109* (2013.01); *H01L 2224/49429* (2013.01); *H01L 2924/00014* (2013.01); *H01L 2924/12042* (2013.01)

(58) Field of Classification Search
CPC . H01L 2224/48137; H01L 2924/12041; H01L 27/153; H01L 33/54; H01L 2224/48; H01L 2224/04042; F21S 48/1109; F21S 48/1145; F21S 8/04; F21S 4/28; F21S 8/02; F21S 48/1163
See application file for complete search history.

(56) References Cited

U.S. PATENT DOCUMENTS

| | | | | |
|---|---|---|---|---|
| 8,482,015 | B2* | 7/2013 | Hakamata | F21S 48/1109 257/734 |
| 8,575,639 | B2* | 11/2013 | Hussell | H01L 25/0753 257/100 |
| 9,039,257 | B2* | 5/2015 | Noro | F21V 19/0035 362/382 |
| 9,243,791 | B2* | 1/2016 | Agatani | H01L 25/0753 |
| 9,245,873 | B2* | 1/2016 | Sasano | H01L 25/0753 |
| 9,490,235 | B2* | 11/2016 | Edmond | H01L 25/0753 |
| 2008/0116591 | A1 | 5/2008 | Hayashi et al. | |
| 2008/0128739 | A1* | 6/2008 | Sanpei | H05K 1/0203 257/99 |
| 2010/0027277 | A1* | 2/2010 | Chiang | F21K 9/00 362/382 |
| 2010/0176751 | A1* | 7/2010 | Oshio | H01L 33/62 315/362 |
| 2010/0320483 | A1* | 12/2010 | Kadotani | F21K 9/00 257/88 |
| 2011/0116252 | A1* | 5/2011 | Agatani | F21K 9/00 362/84 |
| 2011/0222264 | A1 | 9/2011 | Matsuda et al. | |
| 2011/0222299 | A1 | 9/2011 | Takahashi et al. | |
| 2011/0316009 | A1 | 12/2011 | Fukasawa | |
| 2012/0044669 | A1 | 2/2012 | Ogata et al. | |

FOREIGN PATENT DOCUMENTS

| | | |
|---|---|---|
| JP | 2002-353267 A | 12/2002 |
| JP | 2008-130863 A | 6/2008 |
| JP | 2011-009298 A | 1/2011 |
| JP | 2011-192703 A | 9/2011 |
| JP | 2011-216875 A | 10/2011 |
| JP | 2012-009622 A | 1/2012 |
| WO | 2008/069204 A1 | 6/2008 |
| WO | 2011/111399 A1 | 9/2011 |

* cited by examiner

LIGHT-EMITTING MODULE

RELATED APPLICATIONS

This application is a national phase of International Application No. PCT/JP2013/005224, filed on Sep. 4, 2013, which in turn claims the benefit of Japanese Application No. 2012-212865, filed on Sep. 26, 2012, the disclosures of which Applications are incorporated by reference herein.

TECHNICAL FIELD

The present invention relates to light-emitting modules in which a plurality of semiconductor light-emitting elements are mounted in rows on a substrate.

BACKGROUND ART

LEDs have the advantages of having long life, good luminance efficiency in a compact form, and vivid light-emission colors, and are widely used in illumination devices, as backlights of display devices, etc. Further, a light-emitting module used in a high capacity illumination device such as a downlight has been developed in which a plurality of LED chips are mounted in a plurality of rows on one substrate, each row sealed over by a sealing member.

As such a light-emitting module, a light-emitting module has been proposed in which the LED chips mounted in rows are connected in parallel by using metal wires (bonding wires) (for example, Patent Literature 1).

Further, in recent years, technology has been proposed in which adjacent LED chips are connected directly to each other by metal wires (for example, Patent Literature 2).

CITATION LIST

Patent Literature

Patent Literature 1: Japanese Patent Application Publication 2012-9622
Patent Literature 2: Japanese Patent Application Publication 2011-9298

SUMMARY OF INVENTION

Technical Problem

However, when electrically connecting adjacent LED chips by using metal wires there is a problem in that light extraction efficiency is reduced.

A typical LED chip is quadrilateral in plan view, having a pair of connecting portions of different polarity on a center line connecting midpoints of two opposing sides. Such an LED chip is mounted on a substrate such that the center line and row direction are perpendicular, and metal wires connect the connecting portions of adjacent LED chips in the row direction.

In such a case, the metal wires necessarily intersect an upper surface of the LED chip, causing light extraction efficiency from the LED chip to be reduced.

The present invention, in view of the above technical problem, has an aim of improving light extraction efficiency in a light-emitting module composed of a plurality of semiconductor light-emitting elements connected in parallel by using metal wires that electrically connect adjacent semiconductor light-emitting elements.

Solution to Problem

To achieve the above aim, in one aspect of the present invention, a light-emitting module comprises: at least one row of a plurality of semiconductor light-emitting elements mounted on a substrate; metal wires connecting in parallel adjacent ones of the semiconductor light-emitting elements within the at least one row; and at least one line-shaped sealing member sealing the semiconductor light-emitting elements, wherein each semiconductor light-emitting element has, on an upper surface thereof that has a quadrilateral shape, a pair of connecting portions having different polarities from each other, the pair of connecting portions being aligned on or near a diagonal of the quadrilateral shape, the diagonal intersects a row direction along which the semiconductor light-emitting elements within the at least one row are arranged and connecting portions having identical polarity are positioned on an imaginary line parallel or substantially parallel to the row direction, and the metal wires intersect two sides extending from a corner, on the diagonal, of the upper surface of each of the semiconductor light-emitting elements when viewed from a direction perpendicular to a mounting surface of the substrate for mounting the semiconductor light-emitting elements.

To achieve the above aim, in one aspect of the present invention, a light-emitting module comprises: at least one row of a plurality of semiconductor light-emitting elements mounted on a substrate; metal wires connecting in parallel adjacent ones of the semiconductor light-emitting elements within the at least one row; and at least one line-shaped sealing member sealing the semiconductor light-emitting elements, wherein each semiconductor light-emitting element has, on an upper surface thereof that has a quadrilateral shape, a pair of connecting portions having different polarities from each other, a diagonal intersects a row direction along which the semiconductor light-emitting elements within the row are arranged and connecting portions having identical polarity are positioned on an imaginary line parallel or substantially parallel to the row direction, the metal wires intersect sides extending from a corner, on the diagonal, of the upper surface of each of the semiconductor light-emitting elements when viewed from a direction perpendicular to a mounting surface of the substrate for mounting the semiconductor light-emitting elements, the upper surface of each of the semiconductor light-emitting elements has sides of length a and sides of length b and is a quadrilateral shape having four right angles, a connecting portion of the connecting portions is within an area enclosed by an imaginary line perpendicular to the diagonal that passes through a position on the diagonal and two sides extending from a corner of the upper surface nearest the position, where x is a distance between the position and the corner of the upper surface nearest the position and the distance x satisfies $x < a^2 b/(a^2+b^2)$.

Advantageous Effects of Invention

According to the light-emitting module of the above aspects, lengths of portions of the metal wires intersecting upper surfaces of the semiconductor light-emitting elements are shorter when compared to a light-emitting module in which a center line of semiconductor light-emitting elements is perpendicular to the row direction and adjacent ones of the semiconductor light-emitting elements are connected by metal wires that extend in the row direction. In this way, light extraction efficiency is improved.

EMBODIMENT

Figure 1:
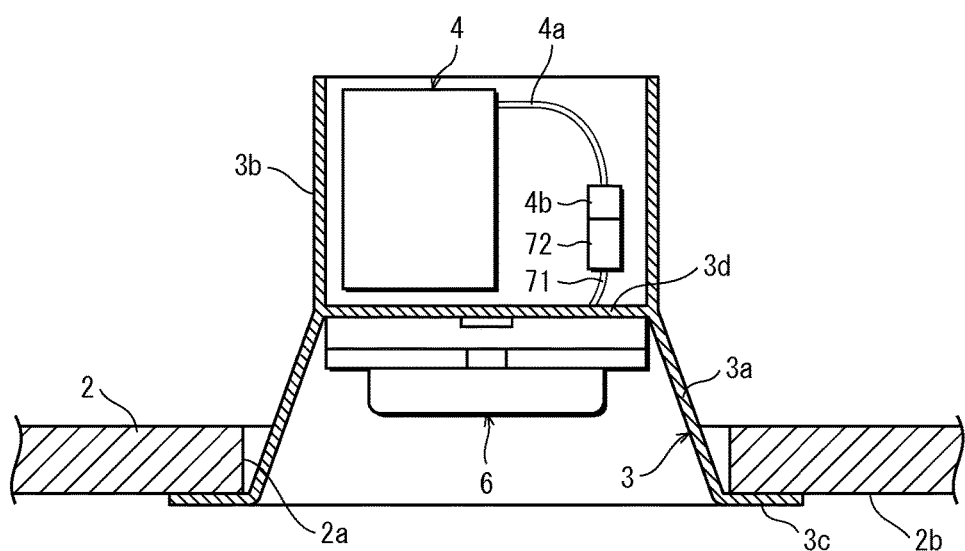
FIG. 1 is a cross-section illustrating an illumination device 1 using a light-emitting module 10 pertaining to an embodiment.

Overview of One Aspect of the Present Invention

A light-emitting module pertaining to one aspect of the present invention is a light-emitting module comprising: at least one row of a plurality of semiconductor light-emitting elements mounted on a substrate; metal wires connecting in parallel adjacent ones of the semiconductor light-emitting elements within the at least one row; and at least one line-shaped sealing member sealing the semiconductor light-emitting elements, wherein each semiconductor light-emitting element has, on an upper surface thereof that has a quadrilateral shape, a pair of connecting portions having different polarities from each other, the pair of connecting portions being aligned on or near a diagonal of the quadrilateral shape, the diagonal intersects a row direction along which the semiconductor light-emitting elements within the at least one row are arranged and connecting portions having identical polarity are positioned on an imaginary line parallel or substantially parallel to the row direction, and the metal wires intersect two sides extending from a corner, on the diagonal, of the upper surface of each of the semiconductor light-emitting elements when viewed from a direction perpendicular to a mounting surface of the substrate for mounting the semiconductor light-emitting elements.

Further, the upper surface of each semiconductor light-emitting element may be square, and x may be less than a/2 where a is a length of one side of the upper surface of the semiconductor light-emitting element and x is a distance between a center of a connecting portion of the connecting portions and a corner of the upper surface nearest said connecting portion. In this way, length is reduced of portions of the metal wires intersecting the upper surfaces of the semiconductor light-emitting elements.

Further, among the semiconductor light-emitting elements within the at least one row, a connecting portion of at least one semiconductor light-emitting element not positioned at an end of the at least one row may be connected by two of the metal wires to connecting portions having identical polarity of two other semiconductor light-emitting elements adjacent to the at least one semiconductor light-emitting element, and a second bond of one of the two of the metal wires and a first bond of the other one of the two of the metal wires may overlap when viewed from above the at least one semiconductor light-emitting element. In this way, surface area of the connecting portions is reduced when viewed from above the semiconductor light-emitting elements. Note that here, "overlap" may mean that the first bond and the second bond completely overlap (the first bond is substantially the same size as the second bond or smaller and is positioned on the second bond), and may mean that a portion of the first bond and the second bond overlap.

Further, among the semiconductor light-emitting elements within the at least one row, a connecting portion of at least one semiconductor light-emitting element not positioned at an end of the at least one row may be connected by two of the metal wires to connecting portions having identical polarity of two other semiconductor light-emitting elements adjacent to the at least one semiconductor light-emitting element, and a second bond of one of the two of the metal wires and a first bond of the other one of the two of the metal wires may be configured to not overlap when viewed from above the at least one semiconductor light-emitting element. In this way, the metal wires and the connecting portions are directly connected.

Further, the upper surface of each semiconductor light-emitting element may be rectangular, and x may be less than $a^2b/(a^2+b^2)$ where a and b are lengths of sides of the upper surface of the semiconductor light-emitting element, x is a distance between a center of a connecting portion of the connecting portions and a corner of the upper surface nearest said connecting portion, and sides of length b of semiconductor light-emitting elements that are adjacent within the at least one row face each other. In this way, length is reduced of portions of the metal wires intersecting the upper surfaces of the semiconductor light-emitting elements.

Further, among the semiconductor light-emitting elements within the at least one row, a connecting portion of at least one semiconductor light-emitting element not positioned at an end of the at least one row may be connected by two of the metal wires to connecting portions having identical polarity of two other semiconductor light-emitting elements adjacent to the at least one semiconductor light-emitting element, and a second bond of one of the two of the metal wires and a first bond of the other one of the two of the metal wires may overlap when viewed from above the at least one semiconductor light-emitting element. In this way, surface area of the connecting portions is reduced when viewed from above the semiconductor light-emitting elements. Note that here, "overlap" may mean that the first bond and the second bond completely overlap (the first bond is substantially the same size as the second bond or smaller and is positioned on the second bond), and may mean that a portion of the first bond and the second bond overlap.

Further, among the semiconductor light-emitting elements within the at least one row, a connecting portion of at least one semiconductor light-emitting element not positioned at an end of the at least one row may be connected by two of the metal wires to connecting portions having identical polarity of two other semiconductor light-emitting elements adjacent to the at least one semiconductor light-emitting element, and a second bond of one of the two of the metal wires and a first bond of the other one of the two of the metal wires may be configured to not overlap when viewed from above the at least one semiconductor light-emitting element. In this way, the metal wires and the connecting portions are directly connected.

A light-emitting module pertaining to one aspect of the present invention is a light-emitting module comprising: at least one row of a plurality of semiconductor light-emitting elements mounted on a substrate; metal wires connecting in parallel adjacent ones of the semiconductor light-emitting elements within the at least one row; and at least one line-shaped sealing member sealing the semiconductor light-emitting elements, wherein each semiconductor light-emitting element has, on an upper surface thereof that has a quadrilateral shape, a pair of connecting portions having different polarities from each other, a diagonal intersects a row direction along which the semiconductor light-emitting elements within the row are arranged and connecting portions having identical polarity are positioned on an imaginary line parallel or substantially parallel to the row direction, the metal wires intersect sides extending from a corner, on the diagonal, of the upper surface of each of the semiconductor light-emitting elements when viewed from a direction perpendicular to a mounting surface of the substrate for mounting the semiconductor light-emitting elements, the upper surface of each of the semiconductor light-emitting elements has sides of length a and sides of length b and is a quadrilateral shape having four right angles, a connecting portion of the connecting portions is within an area enclosed by an imaginary line perpendicular to the diagonal that passes through a position on the diagonal and two sides extending from a corner of the upper surface nearest the position, where x is a distance between the position and the corner of the upper surface nearest the position and the distance x satisfies $x < a^2 b/(a^2 + b^2)$.

Further, among the semiconductor light-emitting elements within the at least one row, connecting portions having identical polarity may be connected by at least one of the metal wires. In this way, connections between the connecting portions are easily performed. Further, the at least one row may be provided in a plurality, and spacing between the semiconductor light-emitting elements may be different for each row of the plurality of rows. In this way, when adjacent ones of the semiconductor light-emitting elements are connected by the metal wires, wiring is not required in the substrate and freedom of mounting of the semiconductor light-emitting elements is increased.

Further, the plurality of rows may be connected in series. In this way, luminance consistency is easily ensured.

Embodiment

Pertaining to the embodiment, a light-emitting module, a lamp unit including the light-emitting module, and an illumination device are described with reference to the drawings.

FIG. 1 is a cross-section illustrating an illumination device 1 incorporating a light-emitting module 10 pertaining to the embodiment.

The illumination device 1 is a so-called downlight mounted to be embedded in a ceiling 2. The illumination device 1 includes a fixture 3, a circuit unit 4, and a lamp unit 6.

1. Fixture 3

The fixture 3 is metal, and has a lamp housing portion 3a, a circuit housing portion 3b, and an outer flange portion 3c. The lamp housing portion 3a is a bottomed cylindrical shape and the lamp unit 6 is detachably attached to the inside (bottom) thereof. The circuit housing portion 3b is extended from the bottom side of the lamp housing portion 3a and the circuit unit 4 is housed therein. The outer flange portion 3c is annular, and extended outward from an opening of the lamp housing portion 3a.

In other words, the fixture 3 has a cylindrical shape having a partition wall 3d at a central portion in a direction perpendicular to the ceiling 2. The lamp unit 6 is housed in an internal space from the partition wall 3d of the fixture 3 to an end portion (lower portion) on a side close to the ceiling 2. The circuit unit 4 is housed in an internal space from the partition wall 3d to an end portion (upper portion) on a side far from the ceiling 2.

The fixture 3 is attached to the ceiling 2 in a state in which the lamp housing portion 3a and the circuit housing portion 3b are embedded in an embedding hole 2a that passes through the ceiling 2, and the outer flange portion 3c is in contact with a lower surface 2b of the ceiling 2 at a periphery of the embedding hole 2a.

2. Circuit Unit 4

The circuit unit 4 includes a circuit that causes the lamp unit 6 to be lit. Further, the circuit unit 4 includes a power supply line 4a that is electrically connected to the lamp unit 6. A connector 4b that is detachably attached to a connector 72 of leads 71 of the lamp unit 6 is attached to an end of the power supply line 4a.

The circuit includes an AC/DC converter, is electrically connected to an external commercial AC power source (not illustrated), converts power inputted from the commercial AC power source to DC voltage (DC electricity) suitable for the light-emitting elements 12, and supplies converted power to the lamp unit 6. In this way, all of the light-emitting elements 12 are collectively controllable to be lit.

Note that in the illumination device 1, the lamp unit 6 and the circuit unit 4 are separate units, but the illumination device 1 may include a circuit corresponding to the circuit unit 4 integrated into a lamp unit. Further, the circuit unit 4 is housed inside the fixture 3, but may be positioned outside a fixture.

3. Lamp Unit 6

Figure 2:
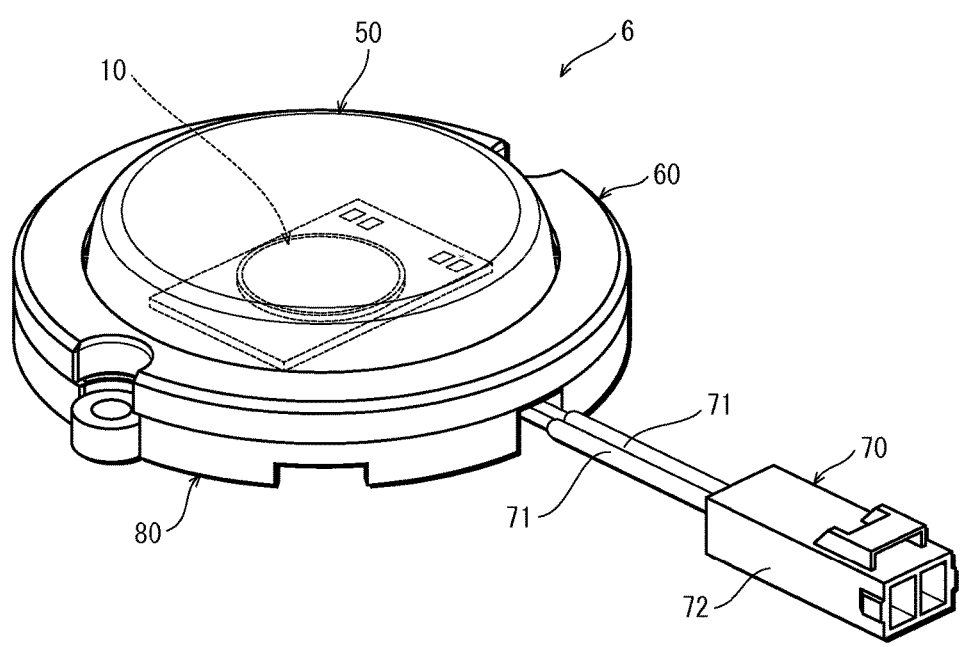
FIG. 2 is a perspective view of a lamp unit 6 in the illumination device 1.
Figure 3:
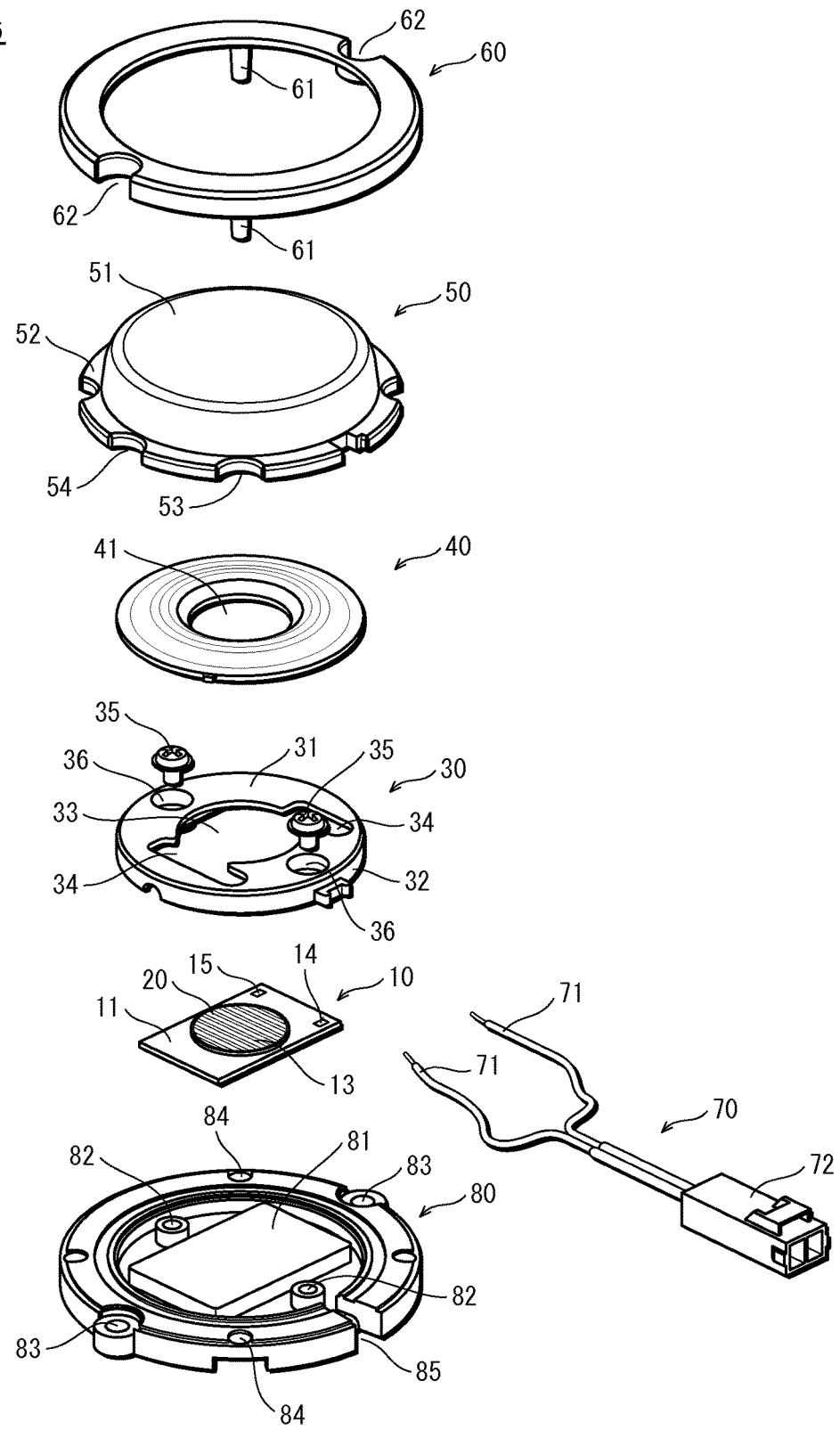
FIG. 3 is an exploded perspective view of the lamp unit 6.

FIG. 2 is a perspective view of the lamp unit 6 and FIG. 3 is an exploded perspective view of the lamp unit 6.

The lamp unit 6 includes the light-emitting module 10 as a light source. The lamp unit 6, aside from the light-emitting module 10, includes a base 80, a holder 30, a decorative cover 40, a cover 50, a cover pressing member 60, a wiring member 70, etc.

(1) Base 80

The base 80 is, for example, made from a material having a high thermal conductivity. As such a material, a metal material such as aluminium may be used. The base 80 is disk-shaped die-cast aluminium, and has a mounting portion 81 in a central area of an upper surface thereof. The light-emitting module 10 is mounted on the mounting portion 81.

A securing means is provided on an upper surface of the base 80 for securing the holder 30. Here, the securing means uses a threaded structure. Specifically, the securing means includes assembly screws 35 for securing the holder 30 and screw holes 82 for threading the assembly screw 35. The screw holes 82 are provided on both sides of the mounting portion 81.

Insertion holes 83, boss holes 84, and a cut-out portion 85 are provided in a peripheral portion of the base 80. The insertion holes 83 are for attaching the lamp unit 6 to the fixture 3. The boss holes 84 are a securing means used when securing the cover pressing member 60 (details are provided later). The cut-out portion 85 is for the wiring member 70 to pass through.

(2) Holder 30

The holder 30 is, for example, made from resin material. The holder 30 is a bottomed cylindrical shape and includes a pressing plate 31 having a disk shape and a peripheral wall portion 32 having a cylindrical shape that extends towards the base 80 from a peripheral edge of the pressing plate 31. The light-emitting module 10 is secured to the base 80 by being pressed to the mounting portion 81 by the pressing plate 31.

A window hole 33 is present in a central area of the pressing plate 31, allowing light from the light-emitting module 10 to pass through. The window hole 33 is formed to correspond to a mounting area 20 on the light-emitting module 10 on which the light-emitting module 12 is mounted. Here, the window hole 33 is circular in plan view.

Openings 34 are formed in the pressing plate 31 that are contiguous with the window hole 33. The openings 34 prevent the leads 71 that are connected to the light-emitting module 10 from interfering with the holder 30.

Insertion holes 36 are formed through a peripheral portion of the pressing plate 31 of the holder 30 at a position corresponding to the screw holes 82 of the base 80, for insertion of the assembly screws 35.

When the holder 30 is being attached to the base 80, initially, the light-emitting module 10 (a portion of the light-emitting module 10 excluding the sealing members 13, etc.) is sandwiched between the base 80 and the holder 30 in a state in which the sealing members 13, etc., of the light-emitting module 10 are exposed from the window hole 33 of the holder 30. Subsequently, the assembly screws 35 are inserted into the insertion holes 36 from above the pressing plate 31 of the holder 30, and screwed into the screw holes 82 of the base 80. In this way, the holder 30 and the base 80 are attached.

(3) Decorative Cover 40

The decorative cover 40 is, for example, made from a non-light-transmissive material such as a white, opaque resin, and has an annular shape. The decorative cover 40 is positioned between the holder 30 and the cover 50, and covers and conceals the assembly screws 35, the leads 71 exposed by the openings 34 in the holder 30, etc. The decorative cover 40 also has a window hole 41 in a central area thereof. The window hole 41 allows light from the light-emitting module 10 to pass through the decorative cover 40.

(4) Cover 50

The cover 50 is made from a light-transmissive material such as silicone resin, acrylic resin, glass, etc. In other words, light emitted from the sealing members 13 of the light-emitting module 10 is transmitted through the cover 50 and emitted from the lamp unit 6. The cover 50 has an overall shape of a dome. The cover 50 includes a main body 51 having an optical function, described later, and an outer flange portion 52 extending outward from a peripheral portion of the main body 51. The main body 51 has a function of diffusing light from the light-emitting module 10. Specifically, diffusing material is mixed into the light-transmitting material from which the main body 51 is composed. The outer flange portion 52 is used when securing the cover 50 to the base 80.

(5) Cover Pressing Member 60

The cover pressing member 60 is made from a non-light-transmissive material such as a metal such as aluminium or a white, opaque resin. The cover pressing member 60 has an annular shape to avoid obstructing light emitted from the main body 51 of the cover 50. The outer flange portion 52 of the cover 50 is sandwiched between the cover pressing member 60 and the base 80. In this way, the cover 50 is secured to the base 80.

Boss portions 61 are cylindrical and protrude from a lower side surface of the cover pressing member 60 towards the base 80. Corresponding to the boss portions 61, cutouts 53 that are semicircular are formed in the outer flange portion 52 of the cover 50 and boss holes 84 are formed in a peripheral portion of the base 80.

When securing the cover pressing member 60 to the base 80, the boss portions 61 of the cover pressing member 60 are inserted into the boss holes 84 of the base 80, and end portions of the boss portions 61 that extend from a lower side of the base 80 are exposed to laser light, plastically deforming the end portions to a shape that does not come out of the boss holes 84. In this way, the cover pressing member 60 is secured to the base 80, forming a single unit.

Cut-out portions 54 and 62, which are semicircular in shape, are formed in the outer flange portion 52 of the cover 50 and a peripheral portion of the cover pressing member 60 in positions corresponding to the insertion holes 83 of the base 80. Attachment screws (not illustrated) that are inserted into the insertion holes 83 do not contact the cover pressing member 60 or the cover 50.

By screwing such attachment screws into screw holes (not illustrated) formed in the partition wall 3d of the fixture 3, the lamp unit 6 is detachably attached to the lamp housing portion 3a of the fixture 3.

(6) Wiring Member 70

The wiring member 70 has a pair of leads 71 that are electrically connected to the light-emitting module 10. The leads 71 lead out of the lamp unit 6 via the cut-out portion 85 of the base 80, and ends of the leads 71 are attached to the connector 72.

Ends of the leads 71 opposite to the connector 72 are joined to terminal portions 14 and 15 of the light-emitting module 10 by, for example, soldering.

(7) Light-Emitting Module 10

Figure 4:
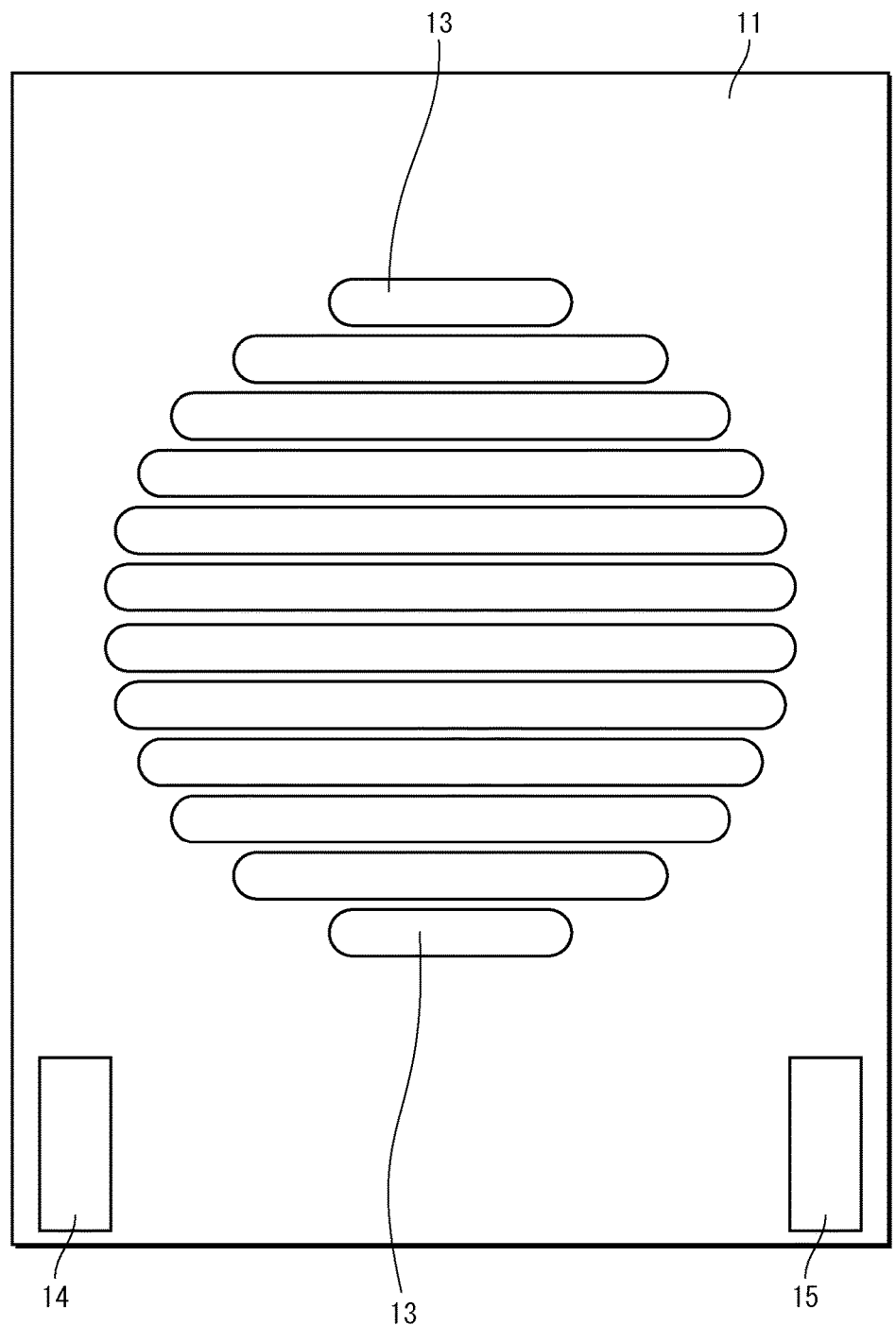
FIG. 4 is a plan view illustrating an example of the light-emitting module 10.
Figure 5:
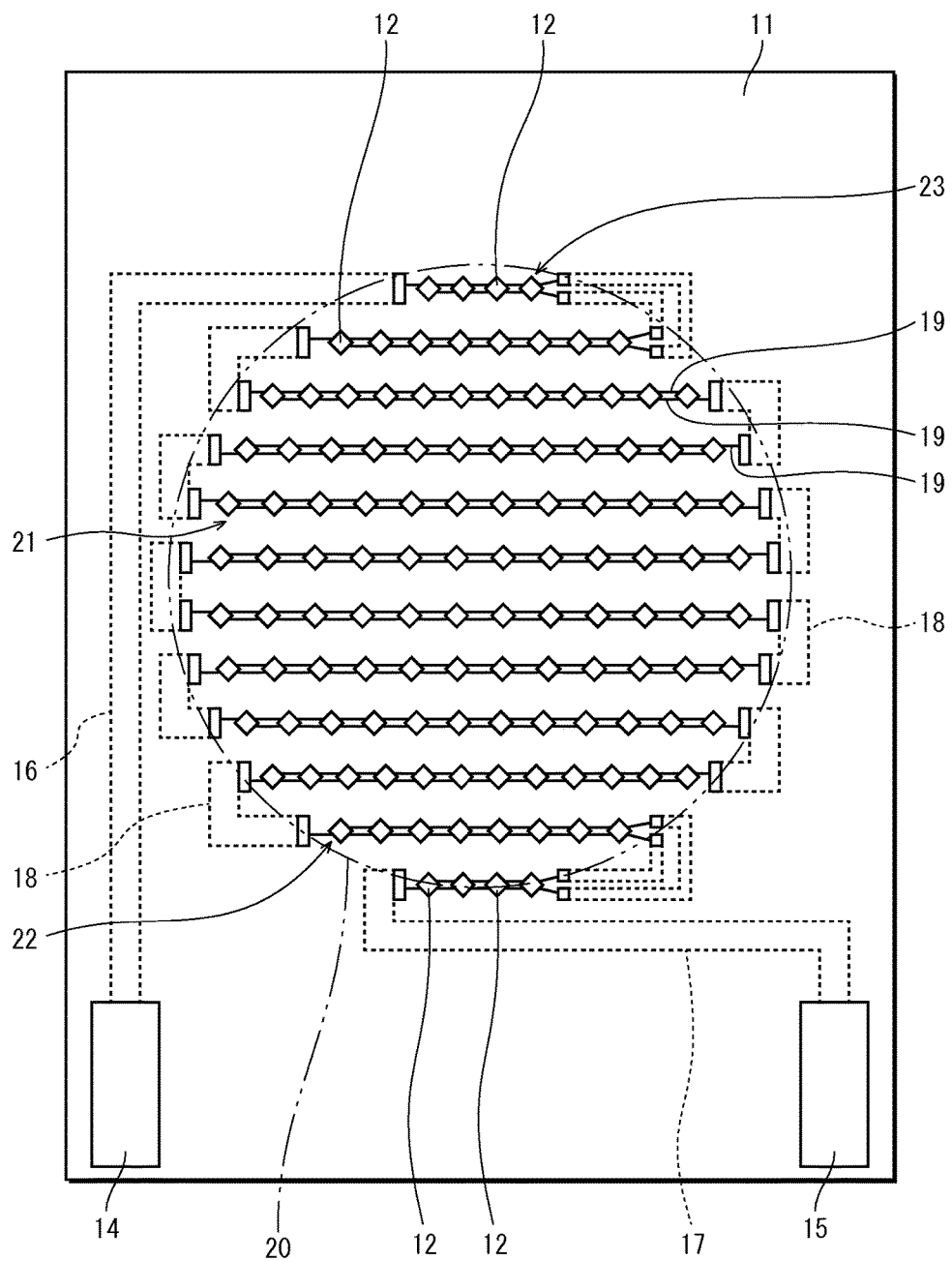
FIG. 5 is a plan view of the light-emitting module 10 in which sealing members are removed.

FIG. 4 is a plan view illustrating an example of the light-emitting module 10. FIG. 5 is a plan view of the light-emitting module 10 in which the sealing members 13 are removed. In these drawings, the paper surface vertical direction is considered a vertical direction and the paper surface lateral direction is considered a lateral direction.

As shown in FIG. 4 and FIG. 5, the light-emitting module 10 includes a substrate 11, a plurality of the light-emitting elements 12 arranged in a plurality of rows on the substrate 11, the sealing members 13 covering the light-emitting elements 12 in each row, the terminal portions 14 and 15, wiring 16, 17, and 18, etc.

As shown in FIG. 4 and FIG. 5, the light-emitting elements 12 are arranged in rows in a mounting area 20 (indicated by a two-dot chain line in FIG. 5) on an upper surface of the substrate 11. In other words, the light-emitting elements 12 are lined up in single rows in the lateral direction in the mounting area 20 in light-emitting element rows 21, 22, and 23, and the light-emitting element rows 21, 22, and 23 are lined up in the vertical direction parallel to each other.

Twelve light-emitting elements are arranged in the lateral direction in each of the light-emitting element rows 21, eight light-emitting elements are arranged in the lateral direction in each of the light-emitting element rows 22, and four light-emitting elements are arranged in the lateral direction in each of the light-emitting element rows 23. The direction in which the light-emitting elements 12 in each of the light-emitting element rows 21, 22, and 23 are arranged is also referred to as a row direction. The row direction matches the lateral direction.

There are eight rows of the light-emitting element rows 21, two rows of the light-emitting element rows 22, and two rows of the light-emitting element rows 23. In the light-emitting element rows 21, as shown in FIG. 5, as distance from the center of the mounting area 20 to the position of the light-emitting element rows 21 increases, spacing between the twelve light-emitting elements 12 decreases (as shown in FIG. 4, length of the sealing members 13 in the lateral direction decreases).

The light-emitting element rows 22 and 23 are composed of light-emitting elements 12 arranged in regions at either end in the vertical direction of the light-emitting element rows 21, and length (length of the sealing members covering the light-emitting elements) of the light-emitting element rows 22 and 23 is shorter than length of the light-emitting element rows 21.

By adjusting length of the light-emitting element rows 21, 22, and 23 in this way, the mounting area 20 having an overall circular shape is obtained.

Light-emitting elements (twelve) in each of the light-emitting element rows 21 are connected in parallel, and each of the light-emitting element rows 21 is connected in series to other light-emitting element rows 21 (including the light-emitting element rows 22) that are adjacent in the vertical direction.

Light-emitting elements 12 in one of the light-emitting element rows 22 and one of the light-emitting element rows 23 (twelve in total) are connected in parallel, and the light-emitting element rows 22 are connected in series to adjacent ones of the light-emitting element rows 21. Thus, light-emitting elements 12 (120 in total) mounted on the mounting area 20 are connected in ten serial rows in each of which twelve light-emitting elements are connected in parallel.

(7-1) Substrate 11

The substrate 11 includes an insulating layer composed of insulating material such as a ceramic or a thermally-conductive resin. The substrate 11 may be entirely the insulating layer, or may be configured as two layers including the insulating layer and a metal layer composed of an aluminium sheet.

Shape of the substrate 11 has no particular limitation, but here is considered to be rectangular.

The terminal portions 14 and 15, and the wiring 16, 17, and 18, are in the insulating layer. The terminal portions 14 and 15 are on a surface of the insulating layer, which is a surface layer. Wiring 16 and 17 connects the terminal portions 14 and 15 to the light-emitting element rows 23 positioned at both ends of the ten serial rows in each of which twelve light-emitting elements are connected in parallel. Each wiring 18 connects two rows among the light-emitting element rows 21, 22, and 23.

Only portions of the wiring 16, 17, and 18 that connects to the light-emitting elements 12 (shown as solid lines in FIG. 5) appears on the surface. Other portions of the wiring 16, 17, and 18 (shown as broken lines in FIG. 5) are inside the insulating layer.

(7-2) Light-Emitting Elements 12

The light-emitting elements 12 are, for example, LED chips that are GaN-based and emit blue light having a dominant wavelength of approximately 430 nm to 470 nm. The light-emitting elements 12 are mounted on the surface of the substrate 11 using chip on board (COB) technology.

Each of the light-emitting elements 12 has a square or rectangular shape in plan view. Here, the light-emitting elements 12 have a square shape.

Note that although the light-emitting elements 12 are here described as LED chips and the light-emitting module 10 is described as an LED module, the light-emitting elements 12 may be laser diodes (LD) or electroluminescence elements (EL elements).

Figure 6:
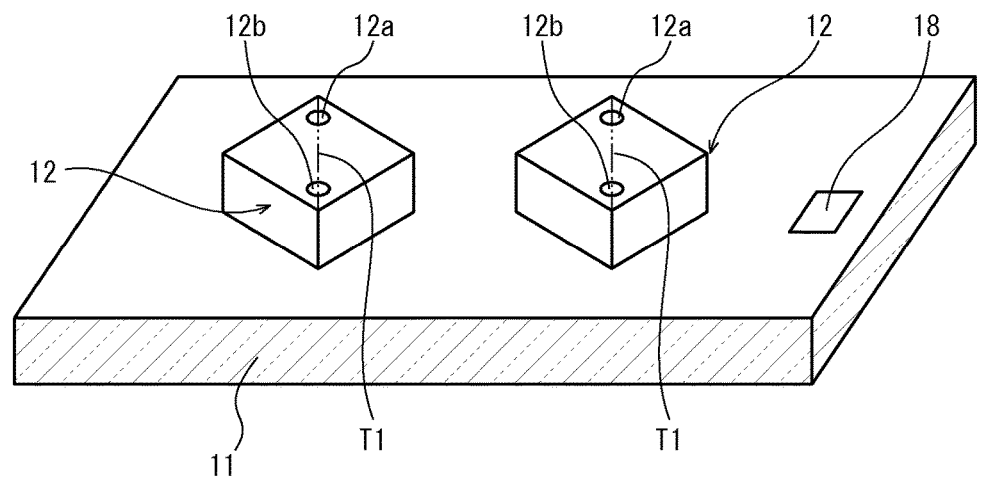
FIG. 6 is a perspective view for describing mounting and connection of light-emitting elements 12, and illustrates a mounted state of the light-emitting elements 12 before connection by metal wires.
Figure 7:
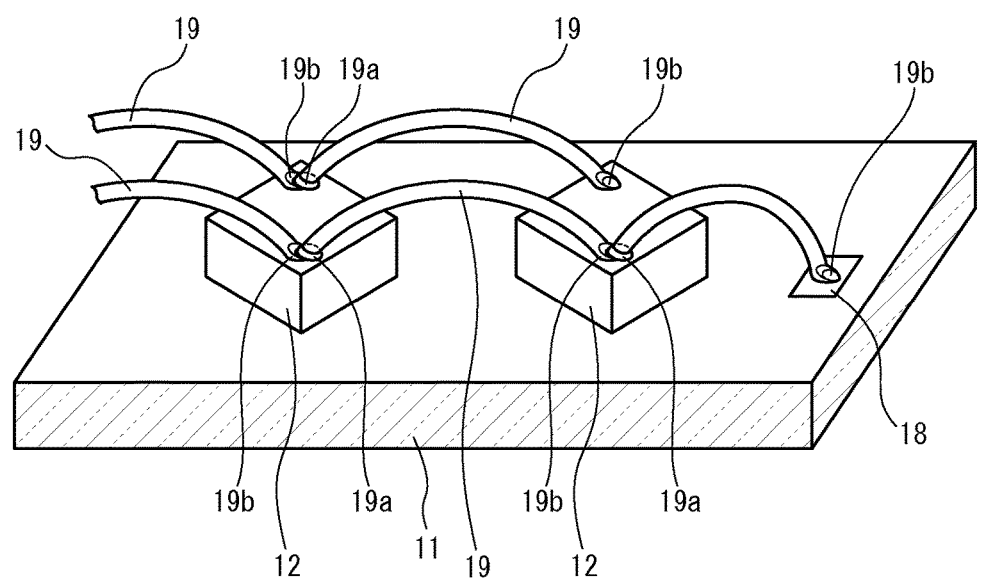
FIG. 7 is a perspective view for describing mounting and connection of the light-emitting elements 12, and illustrates a connected state connected by metal wires 19.

FIG. 6 is a perspective view for describing mounting and connection of the light-emitting elements 12, and illustrates a mounted state of the light-emitting elements 12 before connection by metal wires 19. FIG. 7 is a perspective view for describing mounting and connection of the light-emitting elements 12, and illustrates a connected state connected by the metal wires 19.

Each of the light-emitting elements 12, as shown in FIG. 6, has a pair of connecting portions 12a and 12b on an upper surface thereof that have different polarities from each other. Each pair of the connecting portions 12a and 12b are electrically connected to a P-type electrode and an N-type electrode sandwiching a light-emitting layer in each light-emitting element 12.

Each pair of the connecting portions 12a and 12b is, in plan view, positioned on a diagonal T1, which is one of two diagonals of the square that is an external shape of each of the light-emitting elements 12. Note that here, "connecting portions are positioned on the diagonal" means that, in plan view, the connecting portions 12a and 12b have an overlap with the diagonal T1, and the center of the connecting portions need not be positioned on the diagonal.

The light-emitting elements 12, as shown in FIG. 5, are mounted on the substrate 11 such that the diagonal T1 (see FIG. 8), on which the connecting portions 12a and 12b are positioned, is perpendicular to the row direction (the lateral direction).

The light-emitting elements 12 in each of the light-emitting element rows 21, 22, and 23 (excluding light-emitting elements at both ends of the light-emitting element rows) are, as shown in FIG. 7, electrically connected without a connection pad (a type of wiring formed in insulating layers but not formed in the insulating layers of the present embodiment) by the metal wires 19 to other adjacent ones of the light-emitting elements 12 within the same light-emitting element row 21, 22, or 23.

Each of the light-emitting elements 12 not positioned at ends of the light-emitting element rows 21, 22, and 23 (hereafter, "center-side light-emitting elements") is connected to each connecting portion 12a or 12b having identical polarity of two adjacent light-emitting elements 12 in the row direction by two of the metal wires 19 and 19. In other words, center-side light-emitting elements 12 are connected to two adjacent light-emitting elements 12 by four of the metal wires 19.

The two of the metal wires 19 of each of the connecting portions 12a and 12b of the center-side light-emitting elements 12 are bonded to the connecting portion 12a or 12b such that a second bond 19b of one of the two metal wires 19 overlaps with a first bond 19a of the other of the two metal wires 19 when viewed from above the light-emitting element 12.

A technique for connecting adjacent ones of the light-emitting elements 12 by the metal wires 19 may be the same bonding technique used to connect the wiring 16, 17, and 18 of the light-emitting elements 12 to the metal wires 19.

Among the light-emitting elements 12 in the light-emitting element rows 21, 22, and 23, one of the two of the connecting portions 12a and 12b of each of the light-emitting elements 12 positioned at both ends of each of the light-emitting element rows 21, 22, and 23 is, as shown in FIG. 7, connected to an adjacent one of the wiring 16, 17, and 18 by one of the metal wires 19.

(7-3) Sealing Members 13

Each of the light-emitting element rows 21, 22, and 23 are provided with one of the sealing members 13, which cover a plurality of the light-emitting elements 12 and have line-shapes extending in the lateral direction (see FIG. 4). By providing each row with the sealing members 13, optical path length of light emitted from the light-emitting elements 12 is made uniform when transmitted through the sealing members 13 and color irregularities are suppressed.

The sealing members 13 are made of light-transmissive material into which wavelength conversion material is mixed, and a portion of light emitted from the light-emitting elements 12 is converted into light of a different wavelength. Further, each of the light-emitting elements 12 is sealed by the sealing members 13.

As the wavelength conversion material, phosphor particles may be used. As the light-transmissive material, for example, a silicone resin, a fluorine resin, a silicone/epoxy hybrid resin, a urea resin, etc., may be used.

A portion of blue light having a dominant wavelength of approximately 430 nm to 470 nm emitted from the light-emitting elements 12 is converted to light having a dominant wavelength of, for example, approximately 540 nm to 640 nm by the wavelength conversion material in the sealing members 13. As a result, white light is emitted due to mixing of light in the wavelength range after conversion and blue light that is not converted.

4. Light Extraction Efficiency

Figure 8:
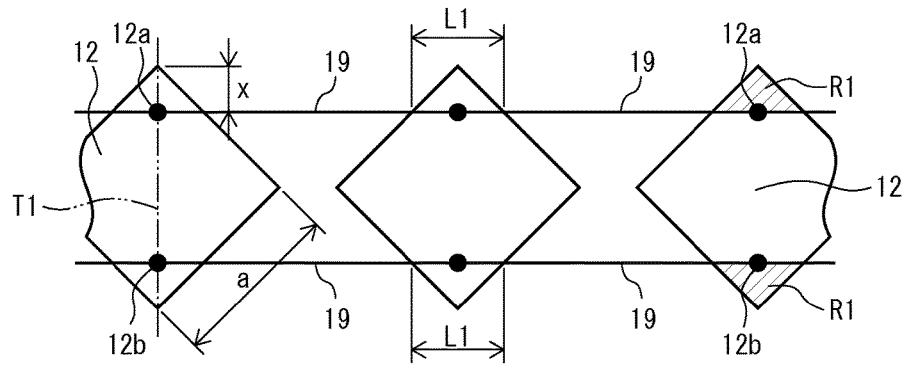
FIG. 8 is a plan view of a portion of a light-emitting module pertaining to the embodiment, illustrating light extraction efficiency.
Figure 9:
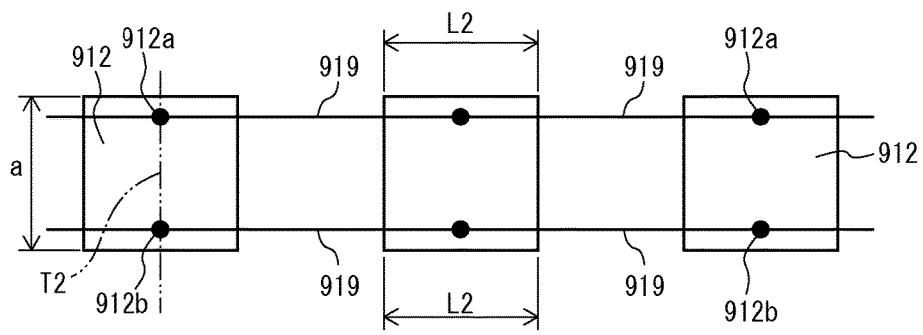
FIG. 9 is a plan view of a portion of a light-emitting module pertaining to conventional technology, illustrating light extraction efficiency.

FIG. 8 is a plan view of a portion of a light-emitting module pertaining to the embodiment, illustrating light extraction efficiency. FIG. 9 is a plan view of a portion of a light-emitting module pertaining to conventional technology, illustrating light extraction efficiency. Note that in connections between connecting portions and metal wires in FIG. 8 and FIG. 9, the first bond and the second bond overlap.

Here, light-emitting elements pertaining to conventional technology are assigned a sign "912", metal wires are assigned a sign "919", and connecting portions of the light-emitting elements 912 are assigned signs "912a" and "912b". Note that in FIG. 8 and FIG. 9, the sealing members 13 are not shown in order that the metal wires 19 and 919 connecting adjacent ones of the light-emitting elements 12 and 912 in the row direction can be seen.

The light-emitting elements 12 and 912 that are adjacent in the row directions are connected as shown in FIG. 8 and FIG. 9 by the metal wires 19 and 919.

The light-emitting elements 12 pertaining to the present embodiment have a square shape in plan view as shown in FIG. 8. The connecting portions 12a and 12b of the light-emitting elements 12 are positioned on the diagonal T1, which is one of two diagonals of the square shape.

Here, when a is one side of the square shape in plan view of the light-emitting elements 12 and x is a distance from the connecting portions 12a and 12b to a nearest corner on the diagonal T1, $$x < a/2 \qquad \text{(Equation 1)}$$

Further, the light-emitting elements 912 pertaining to conventional technology also have a square shape in plan view and a length of one side is also "a", as shown in FIG. 9.

As shown in FIG. 8, the metal wires 19 intersect upper surfaces of the light-emitting elements 12 and connect connecting portions 12a and 12b of adjacent ones of the light-emitting elements 12.

In the same way, as shown in FIG. 9, the metal wires 919 intersect upper surfaces of the light-emitting elements 912 and connect connecting portions 912a and 912b of adjacent ones of the light-emitting elements 912.

Thus, light emitted from the upper surfaces of the light-emitting elements 12 and 912 is hindered by the metal wires 19 and 919 and light extraction efficiency is correspondingly reduced. Of course, reduction in light extraction efficiency is decreased as length in plan view of the metal wires intersecting the light-emitting elements decreases.

Comparing the light-emitting module pertaining to the present embodiment (see FIG. 8) and the light-emitting module pertaining to conventional technology (see FIG. 9), a length of the metal wires 19 intersecting the upper surfaces of the light-emitting elements 12 is shorter in the light-emitting module pertaining to the present embodiment.

In the light-emitting module pertaining to the present embodiment, the connecting portions 12a and 12b of the light-emitting elements 12 are positioned on the diagonal T1 of the upper surfaces of the light-emitting elements 12, the diagonal T1 is perpendicular to (intersected by) the row direction of the light-emitting element rows on the substrate 11, and Equation 1, above, is satisfied.

Thus, the metal wires 19 intersect corner portions of the upper surfaces of the light-emitting elements 12 (in other words, intersect two sides either side of corners positioned on the diagonal T1), and "L1" is the length of intersecting portions of the metal wires 19, as shown in FIG. 8. Because the upper surfaces of the light-emitting elements 12 are square-shaped, L1 is equal to 2x. According to Equation 1, L1, which is equal to 2x, is less than a.

On the other hand, in the light-emitting module pertaining to conventional technology, the connecting portions 912a and 912b of the light-emitting elements 912 are positioned on a center line T2 on the upper surfaces of the light-emitting elements 912, and the center line T2 is perpendicular to a row direction of light-emitting rows on a substrate. Note that the center line T2 is perpendicular to the row direction and connects center points of two opposite sides of the square shape.

Thus, the metal wires 919 intersect opposite sides of the upper surfaces of the light-emitting elements 912, and "L2" is the length of intersecting portions of the metal wires 919, as shown in FIG. 9. L2 is equal to a, which is one side of the square shape in plan view of the light-emitting elements 912.

In this way, the length of the portions of the metal wires 19 intersecting the upper surfaces of the light-emitting elements 12 in the light-emitting module 10 pertaining to the embodiment is "L1", the length of the portions of the metal wires 919 intersecting the upper surfaces of the light-emitting elements 912 in the light-emitting module pertaining to conventional technology is "L2", and L1 is less than L2. In this way, the light-emitting module 10 pertaining to the present embodiment obtains a higher light extraction efficiency than the light-emitting module pertaining to conventional technology.

Modifications

Description is provided above based on an embodiment of the present invention, but the present invention is not limited to the above embodiment. For example, the light-emitting module may be an appropriate combination of a configuration described in the embodiment and configurations described in the modifications below. Further, additional modifications may be made to the light-emitting module without departing from the scope of the technical idea of the present invention.

1. Light-Emitting Module (1) Overall Shape

The light-emitting module 10 pertaining to the above embodiment is described as having an overall shape in plan view that is a rectangular shape. As other shapes, for example, the overall shape in plan view may be polygonal such as square, triangular, pentagonal, etc., or may be circular, elliptical, or oval.

(2) Connections, Etc.

In the light-emitting module 10 pertaining to the above embodiment, the (120) light-emitting elements 12 are in the ten serial rows in each of which twelve light-emitting elements are connected in parallel. However, the light-emitting elements 12 may have other connection forms, and the number of the light-emitting elements 12 is not limited to 120 and may be other numbers.

Further, the light-emitting element rows are composed of three types of light-emitting element rows having different numbers of the light-emitting elements included therein. However, there may be only one type of light-emitting element row having an equal number of the light-emitting elements, or two, four, or more types of light-emitting element rows having different numbers of the light-emitting elements.

However, the number of the light-emitting elements in one of the light-emitting element rows is necessarily a plurality, and the plurality of the light-emitting elements in one of the light-emitting element rows are necessarily connected in parallel by the metal wires.

(3) Mounting Area

The mounting area 20, as shown in FIG. 5, uses three types of light-emitting element rows, the light-emitting element rows 21, 22, and 23, and in plan view has an overall external shape that is circular. However, the mounting area 20 may use one type of light-emitting element row that in plan view has an overall external shape that is a quadrilateral shape such as a square or rectangle, or a polygonal shape such as a hexagon.

However, each of the light-emitting element rows is necessarily sealed by one of the sealing members such that pairs of the metal wires that connect adjacent ones of the light-emitting elements in parallel are not exposed (not exposed to air).

(4) Substrate, Sealing Members

The materials described for the substrate 11 and the sealing members 13 in the embodiment are examples, and other materials may be used.

For example, as the substrate, a ceramic sheet (one layer) may be used, and after forming the wiring on a surface thereof, the surface may be covered (coated) by an insulating resin material such that only the light-emitting elements and portions of the surface at which the light-emitting elements are bonded are exposed.

The sealing material, when conversion of the wavelength of light from the light-emitting elements is not required, need not include the wavelength conversion material. Further, ceramics, etc., may be used as the light-transmissive material that is the primary material of the sealing material.

2. Semiconductor Light-Emitting Elements (1) Form

The semiconductor light-emitting elements 12 in the embodiment have a square shape in plan view, but may have other shapes. As an example of other shapes, the light-emitting elements 12 may have a rectangular shape in plan view.

Figure 10:
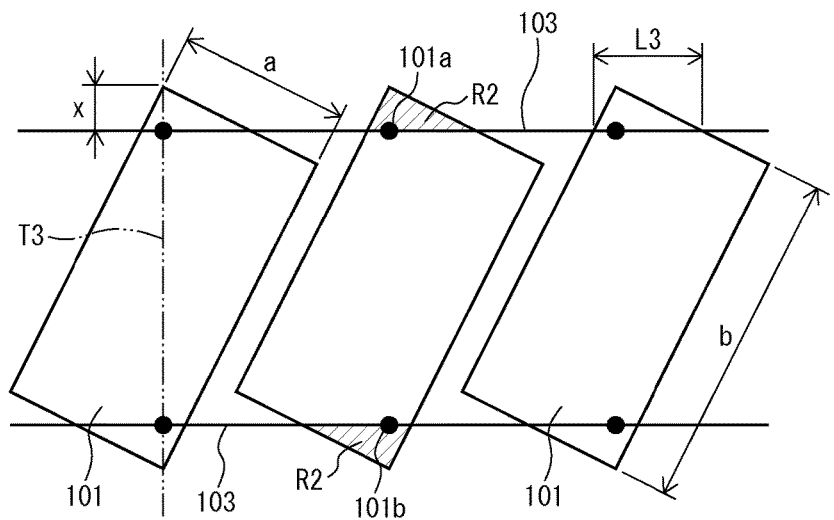
FIG. 10 is a diagram illustrating mounting and connection of semiconductor light-emitting elements 101 having a rectangular shape in plan view.

FIG. 10 is a diagram illustrating mounting and connection of semiconductor light-emitting elements 101 having a rectangular shape in plan view. Note that in connections between connecting portions and metal wires in FIG. 10, the first bond and the second bond overlap.

The semiconductor light-emitting elements 101 have a rectangular shape having a length "a" of a short side and a length "b" of a long side, as shown in the illustration. Here, long sides (side of length b) of the semiconductor light-emitting elements 101 face each other, and a plurality of the semiconductor light-emitting elements 101 are arranged in the lateral direction. The lateral direction is the row direction.

The semiconductor light-emitting elements 101 have pairs of connecting portions 101a and 101b on positions on a diagonal T3 that is one diagonal on upper surfaces of the semiconductor light-emitting elements 101. The semiconductor light-emitting elements 101 are mounted on a substrate such that the diagonal T3 is substantially perpendicular to the row direction. Note that here, the connecting portions 101a and 101b overlap with the diagonal T3 in plan view, and centers of the connecting portions 101a and 101b need not be positioned on the diagonal T3.

Here, when x is a distance from the connecting portions 101a and 101b of the semiconductor light-emitting elements 101 to a nearest corner on the diagonal T3, the following relationship is satisfied.

$$x < a^2 b/(a^2+b^2) \qquad \text{(Equation 2)}$$

Adjacent ones of the semiconductor light-emitting elements 101 in the row direction, as shown in FIG. 10, are electrically connected (connected in parallel) by metal wires 103 that extend in the row direction. Upper surfaces of the semiconductor light-emitting elements 101 are, as shown in FIG. 10, intersected by the metal wires 103, and a length L3 of portions of the metal wires 103 intersecting the upper surfaces satisfies the following relationship.

$$L3 = (b/a + a/b) \times x$$

Because "x" satisfies Equation 2, "L3" is less than "a".

(2) Diagonal

In the embodiment and above examples, the semiconductor light-emitting elements are quadrilateral in plan view and have diagonals. For example, when a four-sided shape has rounded corners, the four-sided shape does not have diagonals, but in such a case, a point of intersection derived by extending adjacent sides may be used as virtual corners.

(3) Arrangement

When the semiconductor light-emitting elements having a rectangular shape are arranged in rows, the long sides of the semiconductor light-emitting elements may face each other in the row direction, as shown in FIG. 10, or the short sides of the semiconductor light-emitting elements may face each other in the row direction.

In a case in which the long sides face each other in the row direction, as shown in FIG. 10, the metal wires connecting adjacent ones of the semiconductor light-emitting elements can be short. In this way, disconnection of the metal wires can be minimized. Further, as the metal wires are shorter, hindrance of light emitted from adjacent ones of the semiconductor light-emitting elements and light emitted from other ones of the semiconductor light-emitting elements is reduced, and overall absorption loss of light due to the metal wires is reduced.

On the other hand, in a case in which the short sides face each other in the row direction, light emitted from sides of the semiconductor light-emitting elements is less likely to be absorbed by adjacent ones of the semiconductor light-emitting elements, and re-absorption loss of light is reduced. In other words, in a case in which the short sides face each other, facing surface areas of adjacent ones of the semiconductor light-emitting elements are reduced. Light emitted radially sideways from the semiconductor light-emitting elements proceeds in the direction of emission. Such light is less likely to be absorbed in correspondence with a reduction in area of side surfaces (facing surfaces) of adjacent ones of the semiconductor light-emitting elements.

In this way, even in a case in which the semiconductor light-emitting elements are mounted such that the short sides are facing each other in the row direction and the connecting portions are positioned on the diagonal, light extraction efficiency is improved over a case in which the semiconductor light-emitting elements are mounted such that the short sides are perpendicular to the row direction and the metal wires intersect two of the short sides that are facing each other.

(4) Position of Connecting Portions

The connecting portions 12a, 12b, 101a, and 101b of the light-emitting elements 12 and 101 are described as being positioned on the diagonals T1 and T3. However, the connecting portions need not be positioned on the diagonals, and may be positioned near the diagonals or near opposing corners.

A range near the diagonals or near the opposing corners is defined as follows. In a case in which upper surfaces of the semiconductor light-emitting elements have a quadrilateral shape having four right-angled corners (a square or rectangular shape) and lengths of two sides sandwiching a corner are lengths a and b, an area R is enclosed by an imaginary line perpendicular to the diagonal that passes through a position on the diagonal and the two sides a and b sandwiching a corner nearest the position, where x is a distance between the position and the corner nearest the position, the distance x satisfying the following relationship within the area R.

$$x < a^2 b / (a^2 + b^2)$$

Note that here, the semiconductor light-emitting elements are mounted on the substrate such that sides of length b face sides of length b of adjacent ones of the semiconductor light-emitting elements.

In a case in which sides of length a and b are equal, the upper surfaces of the semiconductor light-emitting elements have a square shape. In such a case, the area R is equivalent to a hatched portion R1 shown in FIG. 8 (only the semiconductor light-emitting element 12 on the right edge of the figure is hatched). On the other hand, in a case in which sides of length a and b are different, the upper surfaces of the semiconductor light-emitting elements have a rectangular shape. In such a case, the area R is equivalent to a hatched portion R2 shown in FIG. 10 (only the semiconductor light-emitting element 101 at a center of the figure is hatched).

(5) Element Orientation

The light-emitting elements 12 in the embodiment and the light-emitting elements 101 in the modifications are mounted on the substrate in a position in which the diagonals T1 and T3 are substantially perpendicular to the row direction. However, even when not perpendicular, a result of improved light extraction efficiency may be obtained.

In other words, the semiconductor light-emitting elements may be positioned such that the diagonal is inclined relative to a direction perpendicular to the row direction so as to satisfy a predefined condition. The predefined conditions are that length of a portion of the imaginary line above a semiconductor light-emitting element ("L1" in FIG. 8 and "L3" in FIG. 10), the imaginary line passing through a connecting portion, extending parallel to the row direction, and passing through two sides sandwiching a corner on the diagonal (the two sides extending from a corner, on the diagonal, of the upper surface having a quadrilateral shape) is shorter than a length of a side ("L2" and "a" in FIG. 9, and "a" in FIG. 10) parallel to the row direction of semiconductor light-emitting elements arranged such that sides of the light-emitting elements facing adjacent semiconductor light-emitting elements are perpendicular to the row direction.

3. Metal Wires (1) Number

In the embodiment, the two of the metal wires 19 electrically connecting identical polarities of semiconductor light-emitting elements 12 adjacent on both sides of the center-side semiconductor light-emitting elements 12 in the light-emitting element rows 21, 22, and 23 are bonded such that the first bond 19a of one of the two of the metal wires 19 and the second bond of the other one of the two of the metal wires 19 overlap.

However, at the connecting portions, the first bond of one of the metal wires and the second bond of the other one of the metal wires may be bonded so as to not overlap when the semiconductor light-emitting elements are viewed from above.

Figure 11:
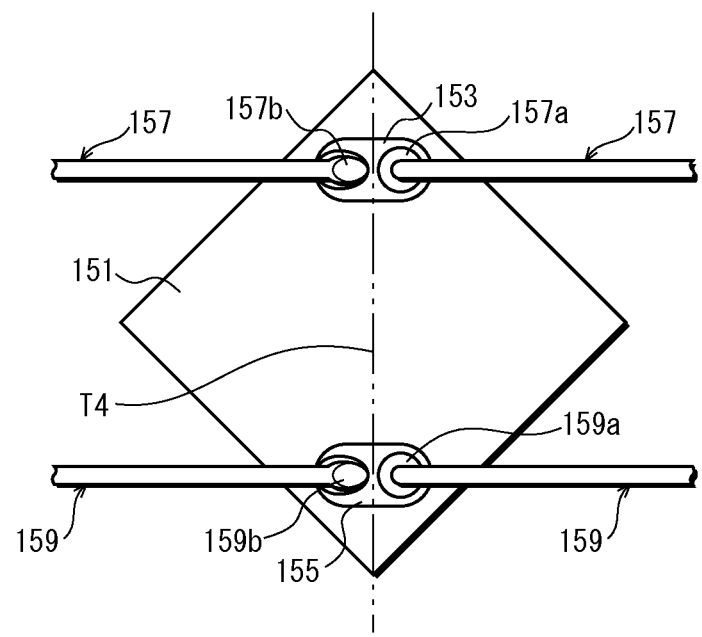
FIG. 11 is a diagram illustrating an example in which a first bond and a second bond do not overlap.
Figure 12:
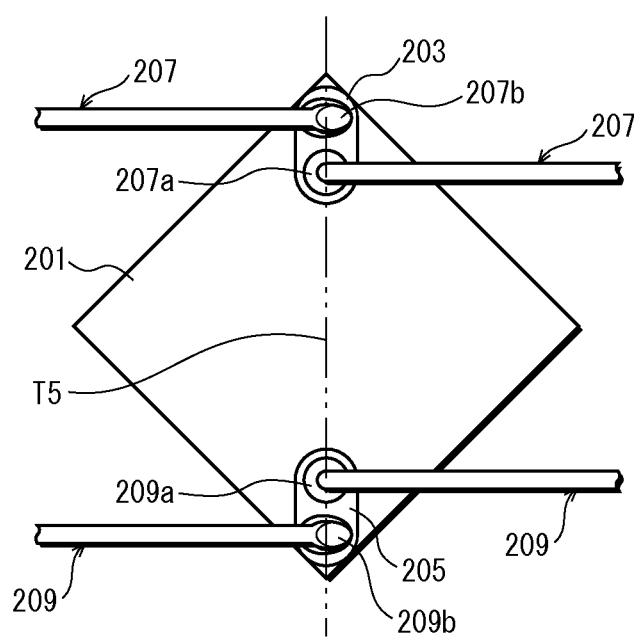
FIG. 12 is a diagram illustrating an example in which the first bond and the second bond do not overlap.

FIG. 11 and FIG. 12 illustrate examples in which the first bond and the second bond do not overlap.

Semiconductor light-emitting elements 151, as shown in FIG. 11, have a square shape in plan view and have connecting portions 153 and 155 on a diagonal T4. Here, only one of the semiconductor light-emitting elements 151 is shown, but a plurality of the semiconductor light-emitting elements 151 are arranged in a single line to the left and right of FIG. 11. In other words, the row direction extends left and right.

The semiconductor light-emitting elements 151 are mounted on a substrate (not illustrated) such that the diagonal T4 is substantially perpendicular to the row direction. Center-side ones of the semiconductor light-emitting elements 151 in light-emitting element rows are connected to the connecting portions 153 and 155 having identical polarities of two adjacent ones of the semiconductor light-emitting elements 151 by two of the metal wires 157 and 159.

Here, the connecting portions 153 and 155 have an elongated shape (laterally elongated) in a direction perpendicular to the diagonal T4. Specifically, the connecting portions 153 and 155 have an elliptical shape having a major axis perpendicular to the diagonal T4. Thus, the two of the metal wires 157 and 159 are bonded to the connecting portions 153 and 155, respectively, second bonds 157b and 159b of one of the metal wires 157 and 159 and first bonds 157a and 159a of the other of the metal wires 157 and 159 lined up left and right (directions perpendicular to the diagonal T4) and not overlapping when the semiconductor light-emitting elements 151 are viewed from above.

In other words, each of the connecting portions 153 and 155 of the center-side ones of the semiconductor light-emitting elements 151 has a first bonding area and a second bonding area that are separated to the left and right for the metal wires 157 and 159 that connect adjacent ones of the semiconductor light-emitting elements 151.

Semiconductor light-emitting elements 201, as shown in FIG. 12, have a square shape in plan view and have connecting portions 203 and 205 on a diagonal T5. Here, only one of the semiconductor light-emitting elements 201 is shown, but a plurality of the semiconductor light-emitting elements 201 are arranged in a single line to the left and right of FIG. 12. In other words, the row direction extends left and right.

The semiconductor light-emitting elements 201 are mounted on a substrate (not illustrated) such that the diagonal T5 is substantially perpendicular to the row direction. Center-side ones of the semiconductor light-emitting elements 201 in light-emitting element rows are connected to the connecting portions 203 and 205 having identical polarities of two adjacent ones of the semiconductor light-emitting elements 201 by two of the metal wires 207 and 209.

Here, the connecting portions 203 and 205 have an elongated shape (vertically elongated) in a direction along the diagonal T5. Specifically, the connecting portions 203 and 205 have an elliptical shape having a major axis along the diagonal T5. Thus, the two of the metal wires 207 and 209 are bonded to the connecting portions 203 and 205, respectively, and second bonds 207b and 209b of one of the metal wires 207 and 209 and first bonds 207a and 209a of the other of the metal wires 207 and 209 are lined up and down (directions along the diagonal T5) and not overlapping when the semiconductor light-emitting elements 201 are viewed from above.

In other words, each of the connecting portions 203 and 205 of the center-side ones of the semiconductor light-emitting elements 201 has a first bonding area and a second bonding area that are separated up and down for the metal wires 207 and 209 that connect adjacent ones of the semiconductor light-emitting elements 201.

As described above, because the first bonding area and the second bonding area of the connecting portions 153 and 155 of the semiconductor light-emitting elements 151 are separated, the metal wires 157 and 159 are connected to the connecting portions 153 and 155 without overlapping, and therefore reliability of electrical connections of the semiconductor light-emitting elements 151 is increased.

Further, because the semiconductor light-emitting elements 151 have connecting portions 153 and 155 having connection areas (bonding areas) for two of the metal wires 157 and 159, firmer connections can be made than when compared to, for example, connecting one of the metal wires 157 or 159 to a single connection area after another one of the metal wire 157 or 159 is already connected (i.e. when a first bonding overlaps a second bonding).

Note that the connecting portions 203 and 205 of the semiconductor light-emitting elements 201 also, in the same way, have the first bonding area and the second bonding area, and therefore firm connections can be made with the metal wires 207 and 209 and reliability of electrical connections with the metal wires 207 and 209 is increased.

In the embodiment and present example, one of the semiconductor light-emitting elements has two of the connecting portions that are connected to the metal wires in the same form, but the two of the connecting portions may be connected to the metal wires in different forms. For example, one of the two of the connecting portions may be connected to the metal wires in the form described in the embodiment, and the other of the two of the connecting portions may be connected to the metal wires in any of the forms described in the present example. Further, among the connecting portions, one of the connecting portions may be connected to the metal wires in any of the forms described in the embodiment and the present example.

(2) Relay Point

In the embodiment and the modifications, the semiconductor light-emitting elements 12, 151, and 201 in the light-emitting element rows are all connected by the metal wires 19, but, for example, a configuration is possible in which only one polarity of the semiconductor light-emitting elements is connected by the metal wires.

Further, when a mounting pitch of the semiconductor light-emitting elements in the row direction is large, relays lands (relay pads) may be provided between adjacent ones of the semiconductor light-emitting elements, and the semiconductor light-emitting elements may be connected via the metal wires connecting the semiconductor light-emitting elements and the relay lands (relay pads).

REFERENCE SIGNS LIST 1 illumination device
10 light-emitting module
11 substrate
12 light-emitting elements
13 sealing members
14, 15 terminal portions
16, 17, 18 wiring
19 metal wires
20 mounting area
21, 22, 23 light-emitting element rows

The invention claimed is:
1. A light-emitting module comprising:
at least one row of a plurality of semiconductor light-emitting elements mounted on a substrate; metal wires connecting in parallel adjacent ones of the semiconductor light-emitting elements within the at least one row; and at least one line-shaped sealing member sealing the semiconductor light-emitting elements, wherein
each semiconductor light-emitting element has, on an upper surface thereof that has a quadrilateral shape, a pair of connecting portions having different polarities from each other, the pair of connecting portions being aligned on or near a diagonal of the quadrilateral shape,
the diagonal intersects a row direction along which the semiconductor light-emitting elements within the at least one row are arranged and connecting portions having identical polarity are positioned on an imaginary line parallel or substantially parallel to the row direction, and
the metal wires intersect two sides extending from a corner, on the diagonal, of the upper surface of each of the semiconductor light-emitting elements when viewed from a direction perpendicular to a mounting surface of the substrate for mounting the semiconductor light-emitting elements.
2. The light-emitting module of claim 1, wherein
the upper surface of each semiconductor light-emitting element is square, and

$x<a/2$ where a is a length of one side of the upper surface of the semiconductor light-emitting element and x is a distance between a center of a connecting portion of the connecting portions and a corner of the upper surface nearest said connecting portion.

3. The light-emitting module of claim 2, wherein
among the semiconductor light-emitting elements within the at least one row, a connecting portion of at least one semiconductor light-emitting element not positioned at an end of the at least one row is connected by two of the metal wires to connecting portions having identical polarity of two other semiconductor light-emitting elements adjacent to the at least one semiconductor light-emitting element, and
a second bond of one of the two of the metal wires and a first bond of the other one of the two of the metal wires overlap when viewed from above the at least one semiconductor light-emitting element.

4. The light-emitting module of claim 2, wherein
among the semiconductor light-emitting elements within the at least one row, a connecting portion of at least one semiconductor light-emitting element not positioned at an end of the at least one row is connected by two of the metal wires to connecting portions having identical polarity of two other semiconductor light-emitting elements adjacent to the at least one semiconductor light-emitting element, and
a second bond of one of the two of the metal wires and a first bond of the other one of the two of the metal wires do not overlap when viewed from above the at least one semiconductor light-emitting element.

5. The light-emitting module of claim 1, wherein
the upper surface of each semiconductor light-emitting element is rectangular, and $$x < a^2 b/(a^2+b^2)$$

where a and b are lengths of sides of the upper surface of the semiconductor light-emitting element, x is a distance between a center of a connecting portion of the connecting portions and a corner of the upper surface nearest said connecting portion, and sides of length b of semiconductor light-emitting elements that are adjacent within the at least one row face each other.

6. The light-emitting module of claim 5, wherein
among the semiconductor light-emitting elements within the at least one row, a connecting portion of at least one semiconductor light-emitting element not positioned at an end of the at least one row is connected by two of the metal wires to connecting portions having identical polarity of two other semiconductor light-emitting elements adjacent to the at least one semiconductor light-emitting element, and
a second bond of one of the two of the metal wires and a first bond of the other one of the t to of the metal wires overlap when viewed from above the at least one semiconductor light-emitting element.

7. The light-emitting module of claim 5, wherein
among the semiconductor light-emitting elements within the at least one row, a connecting portion of at least one semiconductor light-emitting element not positioned at an end of the at least one row is connected by two of the metal wires to connecting portions having identical polarity of two other semiconductor light-emitting elements adjacent to the at least one semiconductor light-emitting element, and
a second bond of one of the two of the metal wires and a first bond of the other one of the two of the metal wires do not overlap when viewed from above the at least one semiconductor light-emitting element.

8. The light-emitting module of claim 1, wherein
the at least one row is provided in a plurality, and
spacing between the semiconductor light-emitting elements is different for each row of the plurality of rows.

9. The light-emitting module of claim 8, wherein
the plurality of rows are connected in series.

10. A light-emitting module comprising:
at least one row of a plurality of semiconductor light-emitting elements mounted on a substrate; metal wires connecting in parallel adjacent ones of the semiconductor light-emitting elements within the at least one row; and at least one line-shaped sealing member sealing the semiconductor light-emitting elements, wherein
each semiconductor light-emitting element has, on an upper surface thereof that has a quadrilateral shape, a pair of connecting portions having different polarities from each other,
a diagonal intersects a row direction along which the semiconductor light-emitting elements within the row are arranged and connecting portions having identical polarity are positioned on an imaginary line parallel or substantially parallel to the row direction,
the metal wires intersect sides extending from a corner, on the diagonal, of the upper surface of each of the semiconductor light-emitting elements when viewed from a direction perpendicular to a mounting surface of the substrate for mounting the semiconductor light-emitting elements,
the upper surface of each of the semiconductor light-emitting elements has sides of length a and sides of length b and is a quadrilateral shape having four right angles,
a connecting portion of the connecting portions is within an area enclosed by an imaginary line perpendicular to the diagonal that passes through a position on the diagonal and two sides extending from a corner of the upper surface nearest the position, where x is a distance between the position and the corner of the upper surface nearest the position, and
the distance x satisfies $$x < a^2 b/(a^2+b^2).$$

11. The light-emitting module of claim 10, wherein
among the semiconductor light-emitting elements within the at least one row, connecting portions having identical polarity are connected by at least one of the metal wires.

* * * * *